(12) United States Patent
Simpson

(10) Patent No.: US 7,983,017 B2
(45) Date of Patent: Jul. 19, 2011

(54) ELECTROSTATIC CHUCK AND METHOD OF FORMING

(75) Inventor: Matthew A. Simpson, Sudbury, MA (US)

(73) Assignee: Saint-Gobain Ceramics & Plastics, Inc., Worcester, MA (US)

(*) Notice: Subject to any disclaimer, the term of this patent is extended or adjusted under 35 U.S.C. 154(b) by 669 days.

(21) Appl. No.: 11/960,344

(22) Filed: Dec. 19, 2007

(65) Prior Publication Data

US 2008/0151467 A1 Jun. 26, 2008

Related U.S. Application Data

(60) Provisional application No. 60/871,882, filed on Dec. 26, 2006.

(51) Int. Cl.
*H01L 21/31* (2006.01)
*H02N 13/00* (2006.01)

(52) U.S. Cl. .................................. 361/234; 279/128

(58) Field of Classification Search .............. 361/234; 279/128
See application file for complete search history.

(56) References Cited

U.S. PATENT DOCUMENTS

| | | | |
|---|---|---|---|
| 4,692,836 A | 9/1987 | Suzuki | |
| 5,151,845 A | 9/1992 | Watanabe et al. | |
| 5,166,856 A | 11/1992 | Liporace et al. | |
| 5,191,506 A | 3/1993 | Logan et al. | |
| 5,324,053 A | 6/1994 | Kubota et al. | |
| 5,384,682 A | 1/1995 | Watanabe et al. | |
| 5,463,526 A * | 10/1995 | Mundt | 361/234 |
| 5,522,131 A | 6/1996 | Steger | |
| 5,560,780 A | 10/1996 | Wu et al. | |
| 5,583,736 A | 12/1996 | Anderson et al. | |
| 5,708,557 A | 1/1998 | Feigenbaum et al. | |
| 5,737,178 A | 4/1998 | Herchen | |
| 5,751,537 A | 5/1998 | Kumar et al. | |
| 5,838,529 A | 11/1998 | Shufflebotham et al. | |
| 5,886,865 A | 3/1999 | Parkhe et al. | |
| 5,909,355 A | 6/1999 | Parkhe | |
| 5,986,875 A * | 11/1999 | Donde et al. | 361/234 |
| 6,055,150 A | 4/2000 | Clinton et al. | |
| 6,215,641 B1 | 4/2001 | Busse et al. | |
| 6,272,002 B1 | 8/2001 | Mogi et al. | |
| 6,351,367 B1 | 2/2002 | Mogi et al. | |

(Continued)

FOREIGN PATENT DOCUMENTS

EP 0498752 A 8/1992

(Continued)

OTHER PUBLICATIONS

Smith et al., Electrical Conduction in Polyimide between 20 and 350 Celcius degree, May 1986, Massachusetts Institute of Technology, 93-106.*

(Continued)

*Primary Examiner* — Stephen W Jackson
*Assistant Examiner* — Tien Mai
(74) *Attorney, Agent, or Firm* — Abel Law Group, LLP

(57) ABSTRACT

A Coulombic electrostatic chuck is disclosed which includes a substrate, a conductive layer overlying the substrate, and an arc elimination layer overlying the conductive layer. The electrostatic chuck further includes a high-k dielectric layer overlying the arc elimination layer, wherein the high-k dielectric layer has a dielectric constant of not less than about 10 and a resistivity of not less than about $10^{11}$ Ohm-cm.

23 Claims, 5 Drawing Sheets

U.S. PATENT DOCUMENTS

| | | | |
|---|---|---|---|
| 6,522,519 B1 * | 2/2003 | Hirayanagi | 361/234 |
| 6,606,234 B1 | 8/2003 | Divakar | |
| 6,678,143 B2 | 1/2004 | Masuda et al. | |
| 6,731,496 B2 | 5/2004 | Hiramatsu et al. | |
| 6,768,627 B1 | 7/2004 | Kitabayashi et al. | |
| 6,771,483 B2 | 8/2004 | Harada et al. | |
| 6,798,488 B2 | 9/2004 | Murata et al. | |
| 6,982,125 B2 | 1/2006 | LaCourse et al. | |
| 6,992,876 B1 | 1/2006 | Nakajima et al. | |
| 7,042,697 B2 | 5/2006 | Tsuruta et al. | |
| 2001/0016410 A1 | 8/2001 | Cheng et al. | |
| 2001/0046112 A1 * | 11/2001 | Herchen | 361/234 |
| 2002/0135967 A1 | 9/2002 | Fuwa et al. | |
| 2002/0167779 A1 | 11/2002 | Carroll et al. | |
| 2003/0010292 A1 | 1/2003 | Kholodenko et al. | |
| 2003/0047283 A1 | 3/2003 | Parkhe et al. | |
| 2003/0087483 A1 | 5/2003 | Iijima et al. | |
| 2005/0152089 A1 | 7/2005 | Matsuda et al. | |
| 2006/0043067 A1 * | 3/2006 | Kadkhodayan et al. | 216/67 |
| 2006/0096946 A1 | 5/2006 | Schaepkens et al. | |
| 2006/0158823 A1 | 7/2006 | Mizuno et al. | |
| 2008/0100984 A1 | 5/2008 | LaFontaine et al. | |

FOREIGN PATENT DOCUMENTS

| | | |
|---|---|---|
| EP | 0506537 A1 | 9/1992 |
| EP | 0805487 A | 11/1997 |
| EP | 0948042 A | 10/1999 |
| EP | 1220311 A | 7/2002 |
| JP | 08019982 A | 1/1996 |
| JP | 11163112 A | 6/1999 |
| JP | 2005317727 A | 11/2005 |
| WO | 95/20838 A | 8/1995 |
| WO | 9847176 | 10/1998 |
| WO | 9916122 A | 4/1999 |
| WO | 20081051369 A | 5/2008 |

OTHER PUBLICATIONS http://en.wikipedia.org/wiki/Polyimide, Sep. 2004.*

Azom, Boron Nitride, Feb. 2001, Azom, www.azom.com/details.asp?articleid=78.

Fitch, C.J., "Development of the Electrostatic Clutch," IBM Journal, Jan. 1957, pp. 49-56.

Integrated Publishing, Dielectric Constants of Material, 2003, http://www.tpub.com/content/neets/14193/css/14193_138.htm.

Lutz et al., "Influence of Absorbed Water on Volume Resistivity of Epoxy Resin Insulators", 2010 International Conference on Solid Dielectrics, Potsdam, Germany, 2010, pp. 1-4.

Microwaves101.com, "Gallium Arsenide", 2007, http://www.microwaves101.com/encyclopedia/galliumarsenide.cfm.

Accuratus.com, "Silicon Carbide, SiC", 2002, http://accuratus.com/silicar.html.

Zykov et al., "Electrical and Optical Properties of Gallium Phosphide Films", 1970, Consults Bureau, http://resources.metapress.com/pdf-preview.axd?code=v707558021844310&size=largest, p. 761.

* cited by examiner

ELECTROSTATIC CHUCK AND METHOD OF FORMING

CROSS-REFERENCE TO RELATED APPLICATION(S)

The present application claims priority from U.S. Provisional Patent Application No. 60/871,882, filed Dec. 26, 2006, entitled "ELECTROSTATIC CHUCK AND METHOD OF FORMING", naming inventor Matthew A. Simpson, which application is incorporated by reference herein in its entirety.

BACKGROUND

1. Field of the Disclosure

This disclosure is directed to an electrostatic chuck (ESC) and is particularly directed to electrostatic chucks for use in processing of display panels.

2. Description of the Related Art

Chucks are used to support and hold wafers and substrates in place within high temperature and corrosive processing chambers such as those used for chemical vapor deposition, physical vapor deposition, or etching. Several main types of chucks have been developed. Mechanical chucks stabilize wafers on a supporting surface by using mechanical holders. Mechanical chucks have a disadvantage in that they often cause distortion of workpieces due to non-uniform forces being applied to the wafers. Thus, wafers are often chipped or otherwise damaged, resulting in a lower yield. Vacuum chucks operate by lowering the pressure between the wafer and the chuck below that of the chamber, thereby holding the wafer. Although the force applied by vacuum chucks is more uniform than that applied by mechanical chucks, improved flexibility is desired. In this respect, pressures in the chamber during semiconductor manufacturing processes tend to be low, and sufficient force cannot always be applied.

Recently, electrostatic chucks (ESCs) have been used to hold workpieces in a processing chamber. Electrostatic chucks work by utilizing a voltage difference between the workpiece and electrodes that can be embedded in the body of the electrostatic chuck, and may apply a more uniform force than mechanical chucks.

Broadly, there exist two types of ESCs: a unipolar type and a bipolar type. The unipolar, or parallel plate ESC includes a single electrode and relies upon plasma used within the processing chamber to form the second "electrode" and provide the necessary attractive forces to hold the substrate in place on the chucking surface. The bipolar, or integrated electrode ESC, includes two electrodes of opposite polarity within the chuck body and relies upon the electric field generated between the two electrodes to hold the workpiece in place.

Additionally, in an ESC, the chucking of a wafer can be achieved using a Coulombic force or Johnsen-Rahbek (JR) effect. Chucks using a JR effect use a resistive layer between the electrode and the workpiece, particularly in workpieces that are semiconductive or conductive. The resistive layer has a particular resistivity, typically less than about $10^{10}$ Ohm-cm, to allow charges within the resistive layer to migrate during operation. That is, during operation of a JR effect ESC, charges within the resistive layer migrate to the surface of the chuck and charges from the workpiece migrate toward the bottom surface thereby generating the necessary attractive electrostatic force. In contrast, ESCs utilizing a Coulombic effect rely upon the embedded electrode as essentially one plate of a capacitor and the workpiece as the second plate of a capacitor, and a dielectric material between the plates. When a voltage is applied across the workpiece and the electrode, the workpiece is attracted to the surface of the chuck.

Despite improvements in ESCs, various industries continue to demand improved performance, for example, those industries processing larger, more massive substrates and workpieces. Notably, the glass industry and particularly the display industry are moving rapidly to produce displays of larger size. This shift to processing of larger workpieces, generally within high temperature and corrosive processing environments, places further demands on ESCs used during processing.

SUMMARY

According to a first aspect, a Coulombic electrostatic chuck is provided that includes a substrate, a conductive layer overlying the substrate, and an arc elimination layer overlying the conductive layer. The electrostatic chuck further includes a high-k dielectric layer overlying the arc elimination layer, wherein the high-k dielectric layer has a dielectric constant of not less than about 10 and a resistivity of not less than about $10^{11}$ Ohm-cm.

According to another aspect, a method is provided for forming a Coulombic electrostatic chuck, the method includes providing a substrate, forming a conductive layer made of a conductive material overlying the substrate, and forming an arc elimination layer overlying the conductive layer. The method further includes forming a high-k dielectric layer overlying the arc elimination layer, wherein the high-k dielectric layer has a dielectric constant of not less than about 10 and a resistivity of not less than about $10^{11}$ Ohm-cm.

According to another aspect, a method of forming an electronic device is provided that includes providing a Coulombic electrostatic chuck having (i) a substrate, (ii) a conductive layer overlying the substrate, (iii) an arc elimination layer overlying the conductive layer, and (iv) a high-k dielectric layer overlying the arc elimination layer. The high-k dielectric layer has a dielectric constant of not less than about 10 and a resistivity of not less than about $10^{11}$ Ohm-cm, the high-k dielectric layer defining a work surface. The method further includes providing a workpiece overlying the work surface, providing a voltage across the electrostatic chuck and the workpiece to maintain the workpiece in proximity to the work surface, and processing the workpiece to form an electronic device.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DESCRIPTION OF THE EMBODIMENT(S)

Figure 1A:
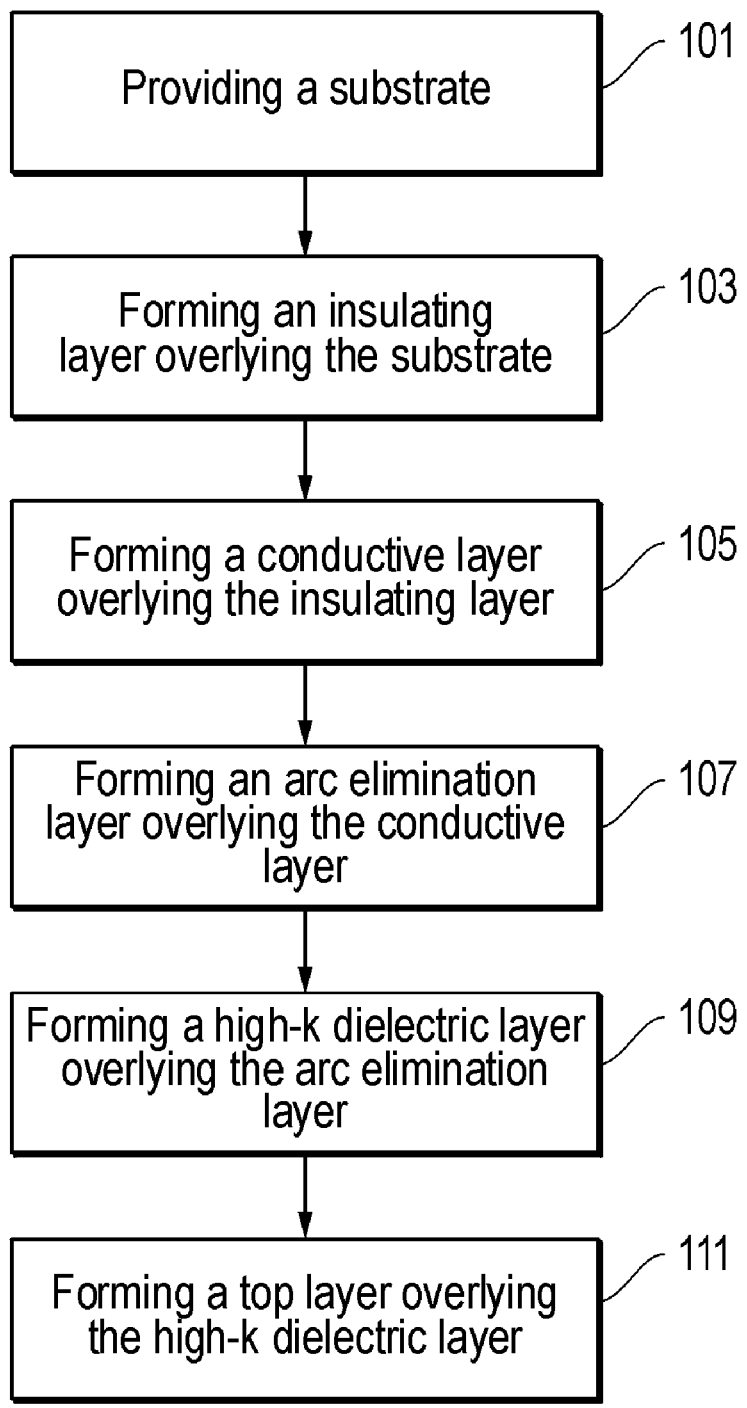
FIG. 1A is a flow chart illustrating a method of forming an ESC according to a particular embodiment.
Figure 1B:
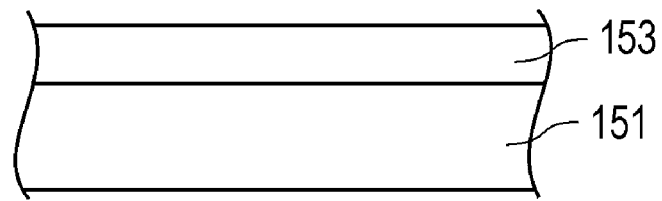
FIG. 1B is a cross-sectional illustration of layers formed during the formation of an electrostatic chuck according to an embodiment.
Figure 1C:
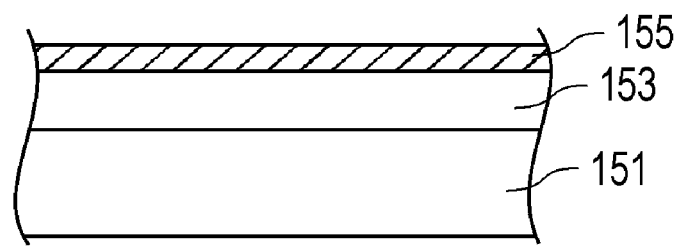
FIG. 1C is a cross-sectional illustration of layers formed during the formation of an electrostatic chuck according to an embodiment.
Figure 1D:
FIG. 1D is a cross-sectional illustration of layers formed during the formation of an electrostatic chuck according to an embodiment.
Figure 1E:
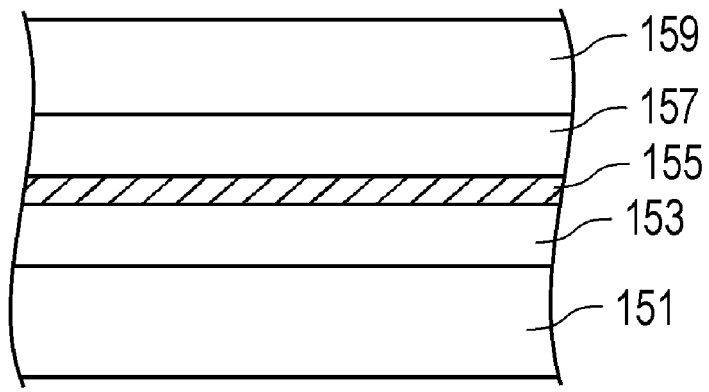
FIG. 1E is a cross-sectional illustration of layers formed during the formation of an electrostatic chuck according to an embodiment.
Figure 1F:
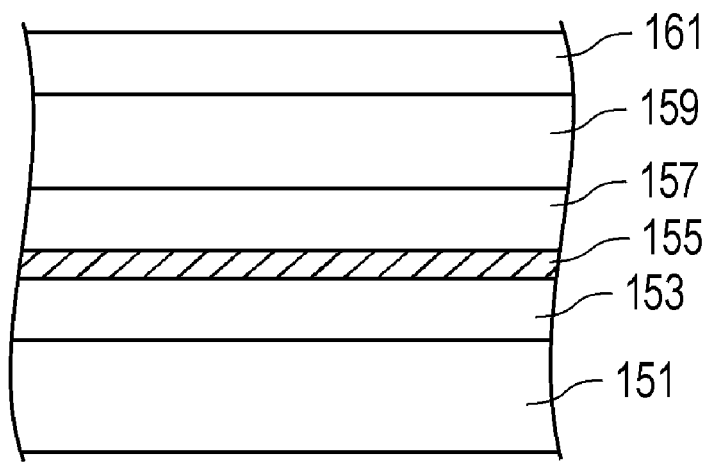
FIG. 1F is a cross-sectional illustration of layers formed during the formation of an electrostatic chuck according to an embodiment.

Referring to FIGS. 1A through 1F, a method according to an embodiment is initiated at step 101 by providing a substrate 151 suitable for forming overlying layers thereon. Suitable materials for the substrate 151 generally include inorganic materials. Such inorganic materials can include single crystalline, polycrystalline, or amorphous inorganic materials including for example, ceramics, glass-ceramics, and glasses. According to a particular embodiment, the substrate includes an insulating material, such as oxide-based materials. Suitable oxide-based materials can include aluminum oxide or silicon oxide, and are formed from a composition containing a majority of alumina oxide or silicon oxide. Such materials may be complex oxides or multiphase materials.

Other suitable inorganic materials for the substrate 151 can include metals and metal alloys. Suitable metals generally include aluminum, ferrous metals, or combinations thereof. In such embodiments utilizing a metal-containing substrate, the metal or metal alloy forms a base of the substrate, and a coating can be applied to a surface of the base. Generally, the overlying layer, noted above, is in contact with the coating. Such a coating can be an inorganic composition, generally being single crystalline, polycrystalline, or amorphous. Suitable coating materials generally include insulating materials, such as a ceramic, glass-ceramic, or glass material. As such, suitable insulating materials can be oxide-based materials, such as yttrium oxide, aluminum oxide, zirconium oxide, or silicon oxide. Such oxides can be compound oxides or multiphase oxides.

Generally, the substrate 151 is robust component having an average thickness of not less than 1.0 mm, such as not less than about 2.0 mm, not less than about 4.0 mm, or even not less than about 10 mm. Embodiments using a base/coating structure typically have a coating thickness of not less than about 200 microns, such as not less than about 300 microns, or even not less than about 400 microns. According to a particular embodiment, the coating thickness is within a range of between about 200 microns to about 800 microns.

Moreover, the substrate 151 is generally a dense article having a low porosity. According to one embodiment, the substrate 151 has a porosity of not greater than about 5.0 vol %, such as not greater than about 2.5 vol %, or still not greater than about 1.0 vol %. In reference to those embodiments utilizing a substrate having a coating, generally the coating is a dense structure. As such, the porosity of the coating is generally not greater than about 20 vol %, such as not greater than about 10 vol %, or even, not greater than about 5.0 vol %.

Referring again to FIGS. 1A through 1F, the method further provides a step 103 of forming an insulating layer 153 overlying the substrate 151. The formation of the insulating layer 153 is generally carried out by a deposition process, including for example, a thick film deposition process such as printing, or a spraying (e.g., thermal spraying), or a thin film deposition process such as chemical vapor deposition or physical vapor deposition. In the context of a thermal spraying process, plasma spraying may be utilized. It will be appreciated, that the insulating layer 153 is particularly suitable for embodiments utilizing a substrate made of an electrically conductive material. The insulating layer 153 may be omitted if the substrate 151 is an electrical insulator.

The materials of the insulating layer 153 are generally inorganic materials. Such inorganic materials can include single crystalline, polycrystalline, or amorphous inorganic materials including ceramics, glass-ceramics, and glasses. In particular, such materials can include oxide-based materials for example, aluminum oxide, silicon oxide, zirconium oxide, hafnium oxide, titanium oxide, chromium oxide, yttrium oxide, iron oxide, barium oxide, barium titanate, and tantalum oxide, or combinations thereof. According to one embodiment, the insulating layer 153 includes at least one of aluminum oxide, zirconium oxide, hafnium oxide, or titanium oxide, and combinations and compound oxides thereof. Moreover, the insulating layer 153 and the substrate 151 can include the same materials, such as particularly the same oxide-based materials, and may be formed of the same composition Typically, the insulating layer 153 is thinner in comparison to the substrate 151 such that the insulating layer 153 has an average thickness of not greater than about 500 microns, such as not greater than about 400 microns, or even, not greater than about 300 microns. Still, the insulating layer 153 may be reasonably thick, generally having a thickness of not less than about 50 microns, such as not less than 100 microns.

Like the substrate 151, the insulating layer 153 may be a generally dense material having low porosity. The porosity of the insulating layer 153 is generally not greater than about 5.0 vol %, such as not greater than about 2.5 vol %, and in some cases, not greater than about 1.0 vol %.

Referring again to FIGS. 1A through 1F, after forming the insulating layer 153 overlying the substrate at step 103, the method further provides a step 105 of forming a conductive layer 155 overlying the insulating layer 153. The formation of the conductive layer 155 is generally carried out by a deposition process, including for example, a thick film deposition process such as printing or a spraying (e.g., thermal spraying) or a thin film deposition process such as chemical vapor deposition or physical vapor deposition. In the context of a thermal spraying process, plasma spraying may be utilized.

The conductive layer 155 is generally thinner in comparison to the substrate 151. According to one embodiment, the conductive layer 155 has an average thickness of not greater than about 100 microns, such as not greater than about 75 microns, and in some cases not greater than about 50 microns. In one particular embodiment, the conductive layer 155 has an average thickness within a range of between about 10 microns and about 50 microns.

In reference to the materials suitable for forming the conductive layer 155, generally the conductive layer 155 is formed of a conductive material, particularly inorganic materials, such as a conductive metal, or metal alloy. Suitable metals can include high temperature metals such as titanium, molybdenum, nickel, copper, tungsten, iron, silicon, aluminum, and combinations or alloys thereof. In one particular embodiment, the conductive layer 155 includes molybdenum. Moreover, particular embodiments utilize a conductive layer 155 having not less than about 25 wt % metal, such as not less than about 50 wt % metal. According to another embodiment, the conductive layer 155 includes not less than about 75 wt % metal, such as not less than about 90 wt % metal, and even in some instances, the conductive layer 155 is made entirely of metal. The foregoing description of metal includes elemental metal, metal composites, and metal alloys.

The conductive layer 155 can be a composite material, and as such, in addition to the conductive material, the conductive layer 155 can contain adhesion promoters. Such adhesion promoters can be inorganic materials, such as conductive, semi-conductive or even insulating materials. Such materials can be single crystalline, polycrystalline, or amorphous, such as for example, ceramics, glass-ceramics, or glasses. Particularly suitable adhesion promoters can include oxide-based materials, such as yttrium oxide, aluminum oxide, zirconium oxide, hafnium oxide, titanium oxide, chromium oxide, iron oxide, silicon oxide, barium titanate, tantalum oxide, barium oxide, or compound oxides thereof. According to one particular embodiment, a suitable adhesion promoter is the same material of the underlying layer and/or overlying layer.

Adhesion promoters are generally present within the conductive layer 155 in an amount of less than about 75 vol %, such as less than about 50 vol %, or less than about 25 vol %. The amount of adhesion promoter can be less, such that the conductive layer 155 contains not greater than about 10 vol %, such as about 5 vol %. In one embodiment, the conductive layer 155 is formed via a thermal spraying process during which the adhesion promoter material is provided simultaneously with the conductor material (e.g., a metal). In one particular embodiment, the conductive layer 155 is formed via a spraying process that utilizes a composite powder composition, which includes the conductor material and the adhesion promoter. The composite powder composition may include not less than about 25 vol % conductor material, such as not less than about 35 vol % conductor material, and in particular instances, not less than about 50 vol % conductor. The composite powder composition typically includes not greater than about 75 vol % adhesion promoter, such as not greater than about 50 vol % adhesion promoter, and even not greater than about 25 vol % adhesion promoter.

In reference to the electrical properties of the conductive layer 155, the sheet resistance of the conductive layer 155 according to one embodiment is not greater than about $10^6$ ohms, such as not greater than about $10^4$ ohms. According to another embodiment, the sheet resistance of the conductive layer 155 is within a range of between about $10^1$ ohms and about $10^6$ ohms.

In further reference to the conductive layer 155, it is generally a continuous layer, conformally deposited over the insulating layer 153 or the substrate 151. According to one embodiment, the conductive layer 155 is a substantially continuous layer of material.

Figure 1G:
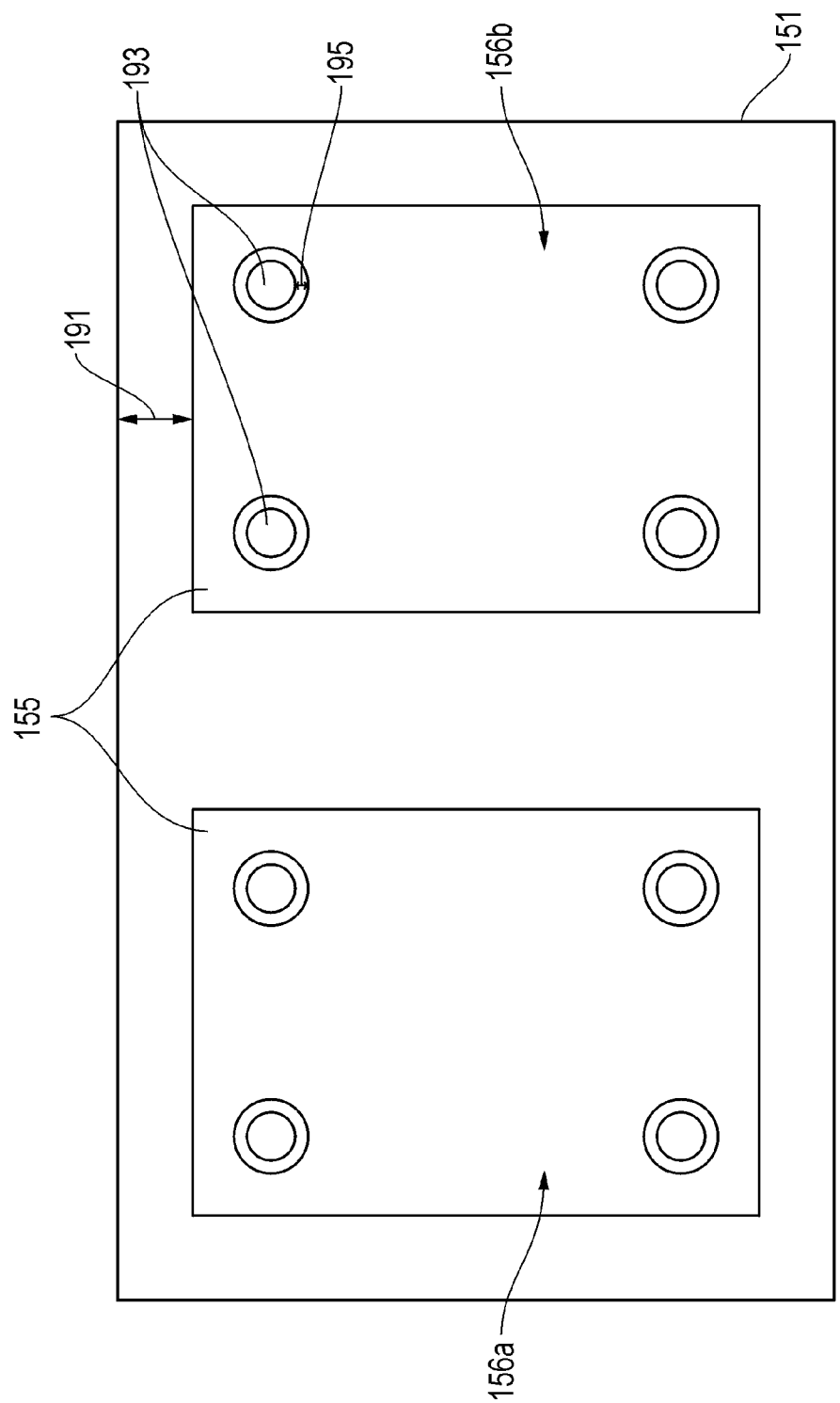
FIG. 1G is a top view of a conductive layer of an ESC according to one embodiment.

Alternatively, the conductive layer 155 may form two isolated regions to respectively form a cathode region 156a and an anode region 156b as shown in FIG. 1G. Further, the conductive layer 155 can include a pattern which accommodates features 193 within the layer and extending through the layers, such features can include cooling holes, perforations for facilitating dechucking, electrical contacts, and the like. Notably, the conductive layer 155 can be patterned to provide suitable spacing 195 from such features. According to one embodiment, such spacing is generally greater than about 0.5 mm, such as greater than about 1.0 mm, or even, greater than about 2.0 mm.

Generally, the conductive layer 155 does not extend to the edge of the substrate 151, which construction may be advantageous to maintain dielectric properties. As such, the conductive layer 155 can be spaced from the edge of the chuck such that a space 191 extends between the edge of the chuck and the conductive layer and extends around the periphery of the conductive layer 155. The average width of this space may be generally greater than about 0.5 mm, such as greater than about 1.0 mm, or even greater than about 2.0 mm.

Referring again to FIGS. 1A through 1F after forming the conductive layer 155 overlying the insulating layer 153 at step 105, the method further provides at step 107 forming an arc elimination layer 157 overlying the conductive layer 155. Formation of the arc elimination layer 157 can be carried out by a deposition process, including for example, a thick film deposition process such as a printing, or a spraying (e.g., thermal spraying) process, or a thin film deposition process such as chemical vapor deposition or physical vapor deposition. In the context of a thermal spraying process, plasma spraying may be utilized.

In reference to the materials of the arc elimination layer 157, generally it includes an inorganic material, and particularly semiconductive materials, which can include a single crystalline, polycrystalline, or amorphous material. Suitable semiconductive materials can include ceramics, glass-ceramics, or glasses. According to one embodiment, the arc elimination layer 157 includes an oxide-based material. Suitable oxide-based materials can include for example, aluminum oxide, silicon oxide, zirconium oxide, hafnium oxide, titanium oxide, chromium oxide, yttrium oxide, iron oxide, barium oxide, barium titanate, hafnium oxide, and tantalum oxide. According to one particular embodiment, suitable oxide-based materials include zirconium oxide, hafnium oxide, barium titanate, and barium oxide, and combinations and compound oxides thereof.

In one embodiment, the arc elimination layer comprises not less than about 50 wt % of an oxide-based material. In another embodiment, the arc elimination layer includes not less than about 65 wt % oxide-based material, such as not less than about 75 wt %, or even not less than about 90 wt % oxide-based material.

Additionally, the arc elimination layer 157 may include other inorganic materials, such as an ionic conductor. Suitable ionic conductors generally include materials having a glass-ceramic or glass phase, such as solid electrolyte materials. According to one embodiment, suitable ionic conductors can include oxide-based materials, such as silicates. Particularly suitable silicate materials include doped silicate materials. Doped silicate materials can be doped with ions, such as cations, and particularly monovalent cations, such as Li. Other ionic conductors can include fluorine-based materials, particularly fluorine-based materials having a glass phase. Suitable fluorine-based materials can include fluorine compositions including metals, particularly transition metals, for example, lanthanum fluoride. As such, the fluorine-based materials can be doped with a cation, particularly a divalent cation, such as Ca.

Typically, the arc elimination layer 157 includes not less than about 50 wt % of such an ionic conductor. According to another embodiment, the arc elimination layer 157 includes not less than about 75 wt %, or even, not less than about 90 wt % of an ionic conductor.

In reference to the electrical characteristics of the arc elimination layer 157, generally the arc elimination layer 157 is formed such that it has a resistance of not greater than about $10^{10}$ Ohms/cm$^2$, such as not greater than about $10^9$ Ohms/cm$^2$. In another embodiment, the arc elimination layer has a resistance of not less than about $10^4$ Ohms/cm$^2$, such that the resistance of the arc elimination layer is within a range of between about $10^4$ Ohms/cm$^2$ to about $10^{10}$ Ohms/cm$^2$. The foregoing resistance values are normalized to the surface area of a contact. In particular, the resistance is measured with upper and lower contacts, each having a surface area, and as such the resistance is normalized for the total surface area of the contacts.

The arc elimination layer 157 typically has an average thickness of not greater than about 500 microns. In one embodiment, the arc elimination layer 157 has an average thickness of not greater than about 400 microns, such as not less than about 300 microns. Still, the arc elimination layer 157 is formed such that it has an average thickness of not less than 50 microns, and generally within a range of between about 100 microns and about 400 microns.

Generally, the arc elimination layer 157 is a dense material having low porosity. The porosity of the arc elimination layer 157 is typically not greater than about 10 vol %, such as not greater than 5.0 vol %, and particularly not greater than about 2.0 vol %.

Referring again to FIG. 1, after forming the arc elimination layer 157 at step 107, the method includes, at step 109, a process of forming a high-k dielectric layer 159 overlying the arc elimination layer 157. Formation of the high-k dielectric layer 159 can be carried out by a deposition process, including, for example a thick film deposition process such as printing or a spraying (e.g., thermal spraying), or a thin film deposition process such as chemical vapor deposition or physical vapor deposition. In the context of a thermal spraying process, plasma spraying may be utilized.

Suitable materials for forming the high-k dielectric layer include inorganic materials, particularly insulating materials. Such materials can be single crystalline, polycrystalline, or amorphous. Suitable insulating materials can include oxide-based materials. Particularly suitable oxide-based materials include aluminum oxide, titanium oxide, chromium oxide, yttrium oxide, iron oxide, barium oxide, barium titanate, hafnium oxide, zirconium oxide, tantalum oxide, lead magnesium niobate, sodium-bismuth titanates, lithium tantalate and combinations and compound oxides thereof. According to a particular embodiment, the high-k dielectric layer includes at least one of titanium oxide, chromium oxide, barium oxide, zirconium oxide, and barium titanate, or a combination or compound oxide thereof. Certain oxide-based species are particularly adapted to be combined with modifiers. For example, aluminum oxide and yttrium oxide alone may be combined with other materials to increase the dielectric constant of the high-k dielectric layer. Species such as iron oxide may be combined with other materials, typically oxide-based materials, to form a combination or compound oxide material having an increased resistivity. As such, the high-k dielectric layer 159 can also incorporate the same oxide-based material(s) as used to form an overlying or underlying layer. Additionally, the high-k dielectric layer 157 can include an organic material. As such, the high-k dielectric layer 157 can be a compound material incorporating inorganic and organic components. Generally, the organic material includes polymers, and may particularly include non-ionic polymers, and/or non-polar polymers. Generally, suitable polymers include polyolefins, such as polyethylene, polypropylene, and polybutene. Additionally, polymers such as polyimides and polyamides can be used. Other suitable polymer compositions include, polyesters, polyethers, acrylates, and silicones, such as dialkylpolysiloxane and fluorosilicones. In conjunction with inorganic materials, such organic compounds facilitate reduced porosity and typically do not comprise greater than about 50 wt % of the high-k dielectric layer 157. Other embodiments utilize smaller amounts, such that the high-k dielectric layer 157 includes less than about 25 wt %, such as less than about 10 wt %, or even less than about 5.0 wt % of an organic compound.

Notably, the high-k dielectric layer 159 includes a dielectric material having a dielectric constant of not less than about 10. According to a particular embodiment, the high-k dielectric layer 159 includes a dielectric material having a dielectric constant of not less than 15, such as not less than about 20, and particularly not less than about 25. As such, the high-k dielectric layer 159 generally has a high electrical resistivity such as not less than about $10^{11}$ Ohm-cm. Other embodiments utilize a high-k dielectric layer 159 having a resistivity of not less than about $10^{13}$ Ohm-cm, and in some cases not less than $10^{15}$ Ohm-cm.

In addition to the high-k dielectric layer 159 including a material having a high dielectric constant, the high-k dielectric layer is generally a robust layer. The high-k dielectric layer 159 typically has an average thickness of not less than 100 microns. According to a particular embodiment, the high-k dielectric layer 159 has an average thickness of not less than about 200 microns, such as not less than about 300 microns. As such, the high-k dielectric layer 159 has an average thickness of not greater than about 500 microns, such that generally the average thickness is within a range of between about 200 microns and about 500 microns.

According to one particular embodiment, the high-k dielectric layer 159 is particularly smooth and provides a work surface for receiving a workpiece. As such, the high-k dielectric layer 159 has an average surface roughness, $R_a$, of not greater than about 40 microns on the top surface of the high-k dielectric layer 159. According to another embodiment, the high-k dielectric layer 159 has a surface roughness ($R_a$) not greater than about 20 microns, and in particular embodiments, not greater than about 10 microns.

Referring again to FIGS. 1A through 1F, after forming a high-k dielectric layer 159 overlying the arc elimination layer at step 109, the process continues at step 111 by forming a capping layer 161 overlying the high-k dielectric layer 159. Formation of the capping layer 161 can be carried out by a deposition process, including, for example a thick film deposition process such as printing or a spraying (e.g., thermal spraying), or a thin film deposition process such as chemical vapor deposition or physical vapor deposition. In the context of a thermal spraying process, plasma spraying may be utilized.

Generally, the capping layer 161 includes an inorganic material, such as a single crystalline, polycrystalline, or amorphous material. Such inorganic materials can include a ceramic, glass-ceramic, or glass material. Particularly suitable materials can include oxide-based materials, such as aluminum oxide and yttrium oxide, or combinations thereof. Such materials can be compound oxides or multiphase oxides. The purity of such oxide-based materials within the capping layer 161 is high to avoid contamination of workpieces during processing. The capping layer 161 generally includes not less than about 75 wt % oxide-based material.

Moreover, the capping layer 161 is typically a dense layer having a low porosity, of which, such porosity is generally closed porosity. The porosity of the capping layer 161 is generally not greater than 5.0 vol %, such as not greater than about 2.0 vol %, and particularly not greater than about 1.0 vol %.

The capping layer 161 has an average thickness that is less than that of the high-k dielectric layer 159, such that it has an average thickness of not greater than about 100 microns, such as not greater than about 50 microns. Still, the capping layer 161 is sufficiently thick, having an average thickness of not less than about 10 microns, such as not less than about 20 microns. According to one particular embodiment, the average thickness of the capping layer 161 is within a range of between about 10 microns to about 50 microns.

According to one particular embodiment, the top surface of the capping layer 161 is particularly smooth. As such, the capping layer 161 has an average surface roughness, $R_a$, of not greater than about 40 microns on the top surface of the capping layer. According to another embodiment, the capping layer 161 has a surface roughness ($R_a$) not greater than about 20 microns, and in particular embodiments, not greater than about 10 microns. Such a surface facilitates suitable contact between the capping layer 161 and the chucked workpiece, providing effective chucking performance. Formation of such a capping layer 161 having such a planar top surface can be completed via a fine grinding or polishing process which may utilize a mechanical or chemical process.

In reference to the geometry of the electrostatic chuck, the elements provided by embodiments here can be utilized to form a chuck for use with insulating substrates. Typically, the electrostatic chuck has an average length of not less than about 1.0 meter, such as not less than about 1.2 meters, and in particular cases, not less than about 1.5 meters. Correspondingly, the average width of the electrostatic chuck is not less than about 0.5 meters, such as not less than 0.75 meters, and particularly not less than about 1.0 meters.

Figure 2:
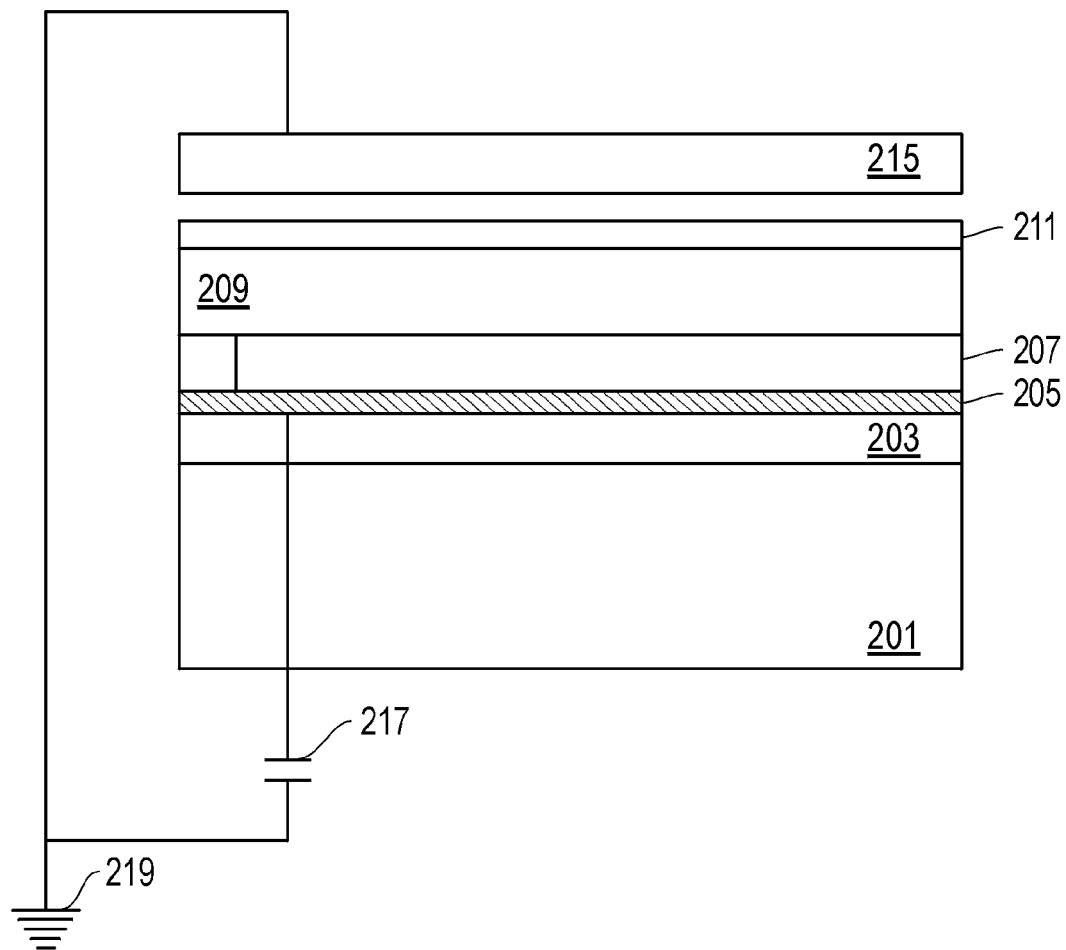
FIG. 2 is a cross-sectional illustration of an ESC according to one embodiment.

Referring to FIG. 2, a cross-sectional diagram of an electrostatic chuck according to a particular embodiment is illustrated. The chuck includes a substrate 201 and an insulating layer 203 overlying the substrate 201. The electrostatic chuck further includes a conductive layer 205 overlying the insulating layer 203, and an arc elimination layer 207 overlying the conductive layer 205. The electrostatic chuck further includes a high-k dielectric layer 209 overlying the arc elimination layer 207 and a capping layer 211 overlying the high-k dielectric layer 209. As also illustrated, a workpiece 215 is being chucked to the capping layer 211. Such a workpiece can be an insulating workpiece such as glass and particularly a glass panel being processed for a display.

In further reference to FIG. 2, the diagram further illustrates a direct current source 217 connected to a ground. Notably, the direct current source 217 is connected to the conductive layer 205 and provides the bias necessary to create a capacitor between the conductive layer 205 and the workpiece 215. It will be appreciated that in certain instances where the workpiece 215 is an insulating material, the chucking force will require the utilization of a plasma within the processing chamber to provide necessary attractive forces to hold the workpiece 215 in place on the chucking surface.

It will be appreciated that while FIG. 2 illustrates a cross-sectional view of the layers, provision of contacts between the conductive layer 205 and cooling channels can be implemented within the electrostatic chuck provided herein. Generally, cooling channels accommodate cooling of the work piece by providing pathways for a cooling gas through the electrostatic chuck to the back surface of the work piece. Such cooling channels can extend through the layers of the ESC, such as from the substrate through to the top surface. Generally, the cooling gas includes a noble gas, such as helium.

This disclosure also provides a method of forming an electronic device using an electrostatic chuck as described in embodiments herein. Once the electrostatic chuck is provided within the processing chamber a workpiece can be provided to the work surface of the electrostatic chuck. According to embodiments herein, the work surface of the electrostatic chucks generally includes a high-k dielectric layer or a capping layer. The workpiece can be provided in proximity to the work surface. The workpiece can generally include an inorganic material and particularly is formed principally of a glass phase, such as a silicon-oxide based component. According to one embodiment, the workpiece is a display panel, intended for final application as a display, or the like. Notably, such displays can include liquid crystal displays (LCDs), plasma displays, electroluminescent displays, displays utilizing thin-film-transistors (TFTs), and the like.

Generally, the workpieces can be large and in some cases, rectangular in shape, such that they have a length of not less than about 0.25 m, such as not less than about 0.5 m or even not less than about 1.0 m. Accordingly, the average width of such workpieces is generally not less than about 0.25 m, such as not less than about 0.5 m, and still, not less than about 1.0 m.

According to one embodiment, an electrostatic chuck and workpiece can be provided within a processing chamber for processing. Generally, processing of the workpiece can include chemical processing, such as a photolithography and chemical processing, and more particularly can include a masking, etching, or deposition process, or a combination of all such processes. In one embodiment, processing of the workpiece includes etching, such as a plasma etching process. According to another embodiment, processing of the workpiece includes a thin-film deposition process, such as one utilizing a vapor deposition process, such as chemical vapor deposition (CVD), and particularly a plasma assisted CVD process.

According to one embodiment, processing of the workpiece includes forming electronic devices on the workpiece, such as transistors, and more particularly, processing of the workpiece includes forming a series of transistors, or an array of transistors, such as a TFT. As such, the workpiece can undergo multiple masking, deposition and etching processes. Moreover, such a process can include deposition of metals, semiconductive materials, and insulating materials.

Generally, such processing is undertaken at reduced pressures, and according to one embodiment, processing of the workpiece is done at a pressure of not greater than about 0.5 atm, such as not greater than about 0.3 atm, or not greater than about 0.1 atm.

According to embodiments described above, an electrostatic chuck incorporating multiple layers is provided which has an improved design and effectiveness. In particular, embodiments describe a combination of features including, a multi-layered design combining particular materials for each of the layers and engineered mechanical and electrical properties of each of the layers selected. Moreover, according to embodiments herein, electrostatic chucks are disclosed that are suitable for holding larger workpieces, particularly insulating workpieces. Accordingly, various embodiments are well-suited to avoid catastrophic failure, particularly in the context of those applications utilizing large electrical potentials, and are well-suited to perform in the presence of electrical potentials in excess of 3 kV and as great as 5 kV. The combination of features provided in various embodiments herein enable improved ESCs having improved performance, durability, and operational lifetime.

While the invention has been illustrated and described in the context of specific embodiments, it is not intended to be limited to the details shown, since various modifications and substitutions can be made without departing in any way from the scope of the present invention. For example, additional or equivalent substitutes can be provided and additional or equivalent production steps can be employed. As such, further modifications and equivalents of the invention herein disclosed may occur to persons skilled in the art using no more than routine experimentation, and all such modifications and equivalents are believed to be within the scope of the invention as defined by the following claims.

What is claimed is:

1. A Coulombic electrostatic chuck comprising:
a substrate;

a conductive layer overlying the substrate;

an arc elimination layer overlying the conductive layer, wherein the arc elimination layer comprises a normalized resistance of not less than about $10^4$ Ohms/cm$^2$ and an ionic conductor; and a high-k dielectric layer overlying the arc elimination layer, wherein the high-k dielectric layer has a dielectric constant of not less than about 10 and a resistivity of not less than about $10^{11}$ Ohm-cm.

2. The electrostatic chuck of claim 1, wherein the substrate has an average thickness of not less than about 2.0 mm.

3. The electrostatic chuck of claim 1, further comprising an insulating layer disposed between the substrate and the conductive layer.

4. The electrostatic chuck of claim 1, wherein the insulating layer comprises an oxide-based material selected from the group of materials consisting of aluminum oxide, silicon oxide, zirconium oxide, hafnium oxide, titanium oxide, chromium oxide, yttrium oxide, iron oxide, barium oxide, barium titanate, tantalum oxide and combinations and compound oxides thereof.

5. The electrostatic chuck of claim 1, wherein the conductive layer comprises a sheet resistance of not greater than about $10^6$ Ohms.

6. The electrostatic chuck of claim 1, wherein the conductive layer comprises a metal selected from the group of metals consisting of titanium, molybdenum, nickel, copper, tungsten, silicon, and aluminum and combinations and metal alloys thereof.

7. The electrostatic chuck of claim 1, wherein the conductive layer comprises an adhesion promoting material.

8. The electrostatic chuck of claim 1, wherein the arc elimination layer comprises an inorganic material.

9. The electrostatic chuck of claim 8, wherein the arc elimination layer comprises an oxide-based material.

10. The electrostatic chuck of claim 9, wherein the oxide-based material is selected from a group of oxide materials consisting of aluminum oxide, silicon oxide, zirconium oxide, hafnium oxide, titanium oxide, chromium oxide, yttrium oxide, iron oxide, barium oxide, barium titanate, tantalum oxide and combinations and compound oxides thereof.

11. The electrostatic chuck of claim 1, wherein the arc elimination layer has an average thickness of not greater than about 500 microns.

12. The electrostatic chuck of claim 1, wherein the arc elimination layer comprises a porosity of not greater than about 10 vol %.

13. The electrostatic chuck of claim 1, wherein the high-k dielectric layer comprises a dielectric material having a dielectric constant not less than about 15.

14. The electrostatic chuck of claim 1, wherein the high-k dielectric layer has a resistivity of not less than about $10^{13}$ Ohm-cm.

15. The electrostatic chuck of claim 1, further comprising a capping layer overlying the high-k dielectric layer.

16. The electrostatic chuck of claim 15, wherein capping layer has a planar surface having a surface roughness ($R_a$) of not greater than about 40 microns.

17. A method of forming an electrostatic chuck comprising:

providing a substrate;

forming a conductive layer comprising a conductive material overlying the substrate;

forming an arc elimination layer overlying the conductive layer, wherein the arc elimination layer comprises a normalized resistance of not less than about $10^4$ Ohms/cm$^2$ and an ionic conductor; and forming a high-k dielectric layer overlying the arc elimination layer, wherein the high-k dielectric layer has a dielectric constant of not less than about 10 and a resistivity of not less than about $10^{11}$ Ohm-cm.

18. The method of claim 17, wherein the method further comprises forming an insulating layer between the substrate and the conductive layer.

19. The method of claim 18, wherein forming the insulating layer comprises a deposition process.

20. The method of claim 17, wherein forming the arc elimination layer comprises a deposition process.

21. The method of claim 17, wherein the method further comprises forming a capping layer overlying the high-k dielectric layer.

22. The method of claim 21, wherein the capping layer has a porosity of not greater than about 5.0 vol %.

23. A method of forming an electronic device comprising:

providing a Coulombic electrostatic chuck comprising (i) a substrate, (ii) a conductive layer overlying the substrate, (iii) an arc elimination layer overlying the conductive layer, wherein the arc elimination layer comprises a normalized resistance of not less than about $10^4$ Ohms/cm$^2$ and an ionic conductor, and (iv) a high-k dielectric layer overlying the arc elimination layer, wherein the high-k dielectric layer has a dielectric constant of not less than about 10 and a resistivity of not less than about $10^{11}$ Ohm-cm, the high-k dielectric layer defining a work surface;

providing a workpiece overlying the work surface;

providing a voltage across the electrostatic chuck and the workpiece to maintain the workpiece in proximity to the work surface; and processing the workpiece to form an electronic device.

* * * * *